United States Patent [19]
Fukutomi et al.

[11] Patent Number: 5,664,325
[45] Date of Patent: Sep. 9, 1997

[54] FABRICATION PROCESS OF WIRING BOARD

[75] Inventors: Naoki Fukutomi, Yuki; Hajime Nakayama, Tsukuba; Yoshiaki Tsubomatsu, Tsuchiura; Kouichi Kaitou, Niihari-gun; Yasunobu Yoshidomi, Shimodate; Yoshihiro Takahashi, Tsukuba, all of Japan

[73] Assignee: Hitachi Chemical Co. Ltd., Japan

[21] Appl. No.: 410,950

[22] Filed: Mar. 27, 1995

Related U.S. Application Data

[63] Continuation of Ser. No. 983,342, Nov. 30, 1992, Pat. No. 5,426,850.

[30] Foreign Application Priority Data

Apr. 23, 1991 [JP] Japan ................................. 4-104675
Nov. 29, 1991 [JP] Japan ................................. 3-316253

[51] Int. Cl.[6] ........................................ H05K 3/06
[52] U.S. Cl. .................. 29/848; 29/DIG. 16; 29/847; 216/52
[58] Field of Search .................. 29/846–849, DIG. 16; 156/151–153; 216/52; 205/78, 125; 427/96–98

[56] References Cited

U.S. PATENT DOCUMENTS

| | | | |
|---|---|---|---|
| 3,324,014 | 6/1967 | Modjeska | 29/848 X |
| 4,306,925 | 12/1981 | Lebow et al. | 29/848 X |
| 4,790,902 | 12/1988 | Wada et al. | 216/52 X |
| 5,017,271 | 5/1991 | Whenell et al. | 427/98 X |

FOREIGN PATENT DOCUMENTS 545328 6/1993 European Pat. Off. .......... 29/DIG. 16

*Primary Examiner*—Peter Vo
*Attorney, Agent, or Firm*—Pennie & Edmonds

[57] ABSTRACT

A wiring board is fabricated through the following steps:

(A) forming, on one side of an elongated carrier metal foil made of a first metal, a thin layer with a second metal whose etching conditions are different from those of the first metal;

(B) forming, on a surface of the thin layer, a desired wiring pattern with a third metal whose etching conditions are different from those of the second metal;

(C) superposing the carrier metal foil on an insulating substrate with the side of the wiring pattern being positioned inside, whereby the wiring pattern is embedded in the insulating substrate; and (D) etching off the carrier metal foil and the thin layer at desired parts thereof.

4 Claims, 6 Drawing Sheets

5,664,325

FABRICATION PROCESS OF WIRING BOARD

This is a continuation, of application Ser. No. 07/983, 342, filed Nov. 30, 1992 now U.S. Pat. No. 5,426,850.

BACKGROUND OF THE INVENTION a) Field of the Invention

This invention relates to a process for the fabrication of a wiring board.

b) Description of the Related Art

The etched foil process has been used most widely as a process for the fabrication of wiring boards. According to the etched foil process, a wiring board is fabricated by forming an etching resist on a copper clad laminate, etching off the copper foil with an etchant at parts, where the etching resist is not formed, to form a desired wiring pattern, and then removing the etching resist.

Although the etched foil process is simple and is excellent in productivity, it cannot form a high-density or high-accuracy pattern because the thickness of the copper foil of a copper clad laminate employed in the process is generally as thick as 35–70 µm so that the side walls of the conductive lines of the resulting wiring pattern are undercut in a step in which the copper foil is etched off at parts where no etching resist is formed.

Further, the conductive lines of the wiring pattern protrude from the surface of the wiring board so fabricated. When another wiring pattern is formed over the conductive lines of the first-mentioned wiring pattern through an insulating layer to fabricate a multilayer wiring board, the rugged profile of the surface of the first-mentioned wiring board poses a problem for the fabrication of a high-density multilayer wiring board.

A process has been proposed, in Japanese Patent Publication No. SHO 54-35670, for example, to fabricate a wiring board in which wiring conductive lines are embedded in a substrate to present a smooth surface.

According to the process disclosed in the above patent publication, wiring conductive lines are formed on a stainless steel sheet, the stainless steel sheet is pressed under heat against an insulating substrate with a prepreg interposed therebetween, and the stainless steel sheet is then removed. Since the wiring conductive lines are directly formed on the stainless steel sheet, some damage may be caused on the wiring conductive lines upon removal of the stainless steel sheet so that a limitation is imposed on the formation of a high-density and high-accuracy wiring pattern. In addition, the use of the stainless steel sheet does not allow to perform the fabrication in a continuous flow.

In the meantime, a wide variety of investigations have been conducted regarding the fabrication of a multilayer wiring board to achieve high densification of a wiring board. Conventional fabrication processes, namely, interconnection process proposed so far for the production of a multilayer wiring board include:

(1) After forming holes through a wiring pattern and an insulating layer, the insides of the holes are metalized by plating or the like so as to achieve interlayer conduction.

(2) Subsequent to formation of an insulating layer on a wiring pattern, the insulating layer is removed at locations where interconnection is desired, followed by surface metallization and simultaneous interconnection.

The process (1) is an interconnection process which is practiced upon fabrication of general multilayer wiring boards. This process however uses a drill for the formation of through-holes. It is therefore difficult to form holes of a diameter smaller than 0.2 mm. Moreover, the positional accuracy of such holes is ±30 µm minimum and is hence insufficient.

The process (2), on the other hand, is used primarily for the formation of a multilayer wiring in semiconductor devices. Owing to the use of a positioning technique which makes use of a photomask, the process (2) is superior by one figure to the process (1) in the diameter reduction of interconnected parts and the positional accuracy of holes. The process (2), however, cannot absorb the ruggedness of an underlying wiring pattern so that the surface remains rugged. This has posed an obstacle not only for the formation of additional layers or the mounting of devices on its surface but also the formation of the surface wiring into a microstructure.

Interconnecting holes are formed with a small diameter in both the process (1) and the process (2) so that a plating solution or the like is not allowed to flow smoothly into the holes. This makes it difficult to form a metal film of a sufficient thickness. This is a serious problem because it directly affects the reliability of the resulting interconnection.

SUMMARY OF THE INVENTION

An object of the present invention is, therefore, to provide a process which can form a high-density and high-accuracy wiring pattern and can fabricate with good productivity a wiring board having a smooth surface with wiring conductive lines embedded in a substrate.

Another object of the present invention is to provide a process for the fabrication of a high-density multilayer wiring board having high reliability in interlayer connection.

DESCRIPTION OF PREFERRED EMBODIMENTS

The wiring board fabrication process according to the first embodiment of the present invention will now be described with reference to FIG. 1.

Figure 1A:
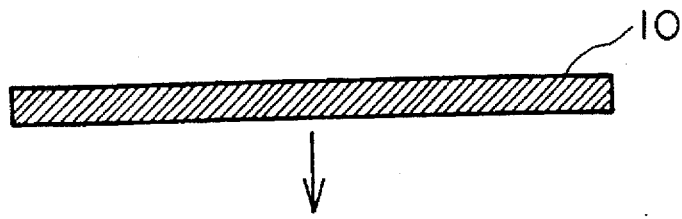
FIG. 1 shows several processing steps of a wiring board fabrication process according to a first embodiment of this invention.
Figure 1B:
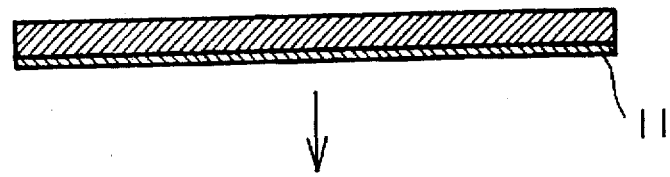
Figure 1C:
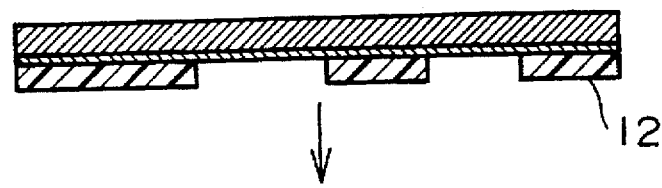
Figure 1D:
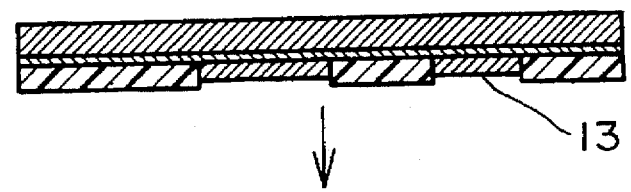
Figure 1E:
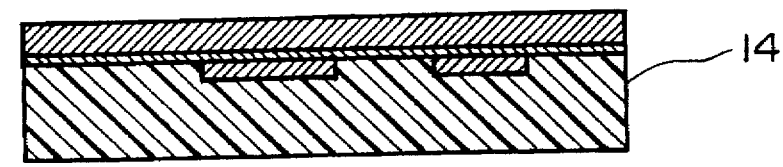
Figure 1F:
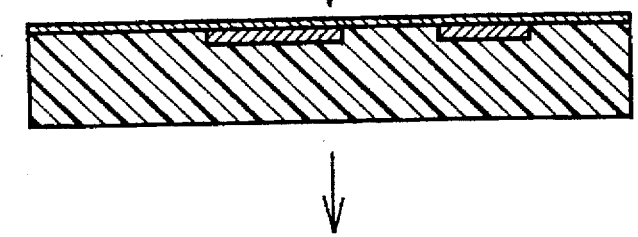
Figure 1G:

On one side of a 35–µm thick copper foil as a carrier metal foil 10 made of a first metal [FIG. 1(a)], nickel was formed by electroplating to a thickness of 1 μm as a thin layer 11 made of a second metal whose etching conditions are different from those of the first metal, [FIG. 1(b)]. Thereafter, a photosensitive resist film 12 was formed, exposed and developed so that grooves of 25 μm in depth were formed corresponding to a desired wiring pattern [FIG. 1(c)]. By feeding an electric current through the copper foil, copper was formed to a thickness of 20 μm on the nickel exposed at the bottoms of the grooves which corresponded to the desired wiring pattern, whereby the desired wiring pattern 13 was formed with the third metal whose etching conditions are different from the second metal. The resist was next stripped off and the copper of the wiring was subjected to oxidation treatment to improve its interlayer adhesion upon lamination. An insulating substrate, namely, a glass fabric-epoxy resin laminate 14 with a glass fabric-epoxy resin prepreg integrated on a surface thereof was then pressed under heat against the copper foil 10, so that the glass fabric-epoxy resin laminate 14 and the copper foil 10 were integrated with the wiring pattern embedded in the insulating substrate [FIG. 1(e)]. Prior to embedding the wiring pattern 13 in the insulating substrate, the side of the wiring pattern 13 may alternatively be coated with a resin so that the wiring pattern 13 is fixed. As the case may be, the stripping of the resist may be omitted. After the surface copper layer (i.e., the carrier metal foil) was selectively etched off with an etchant at a high velocity to the nickel layer formed at the beginning [FIG. 1(f)], the nickel was subjected to quick etching with another etchant [FIG. 1(g)].

The nickel layer as the thin layer 11 made of the second metal can be used as a cathode when gold plating is applied to the wiring conductive lines which require terminal plating in order to permit their use as pad for the wire bonding or connection terminal areas. At the stage of FIG. 1(f), namely, at the stage that the surface copper layer has been selectively etched off with the etchant at the high velocity to the nickel layer formed at the beginning, an etching resist was applied to the nickel layer at parts other than the locations where the terminal plating was required and etching was then conducted to remove the nickel layer which was located on the wiring conductive lines requiring the terminal plating. After the wiring conductive lines which required the terminal plating was plated with gold while using the remaining nickel layer as the cathode, the etching resist was stripped off. As an alternative, at the stage of FIG. 1(f), it is possible to apply a plating resist to the nickel layer at the parts other than the locations where the terminal plating was required, to plate with gold the wiring conductive lines, which required the terminal plating, while using the remaining nickel layer as the cathode, and then to strip off the plating resist. The nickel layer as the thin layer 11 made of the second metal is thereafter removed. Since it is a thin layer, it can be easily etched off while using same as a cathode for terminal plating.

As the carrier metal foil 10 made of the first metal, a foil of a desired metal such as stainless steel or aluminum can be used besides the copper foil. Its thickness can range preferably from 20 μm to 100 μm. For the thin layer 11 made of the second metal, a desired metal such as gold, aluminum, copper or titanium can be used besides nickel. Its preferred thickness can range from 0.1 μm to 10 μm. To form the thin layer 11, a desired process can be used including electroplating, electroless plating or vacuum film-forming (e.g., vacuum deposition, sputtering or the like). Where gold is used, the wiring pattern 13 serves as a substrate film for plating gold when electroless thick gold plating is applied for wire bonding subsequent to the pressed transfer of the wiring pattern 13 and the removal of the carrier metal foil 10. In this case, it is preferred to coat, with a permanent resist, parts other than those requiring the thick gold plating. For the desired wiring pattern 13 made of the third metal, use of copper is preferred. Regarding the first, second and third metals, it is required at least that etching conditions differ between the first metal and the second metal and also between the second metal and the third metal. The metal may be an alloy.

No particular limitation is imposed on the insulating substrate as long as the wiring pattern can be embedded therein. Examples of the insulating substrate include laminates such as a glass fabric-epoxy resin laminate having on a surface thereof a prepreg which has been formed by impregnating a base material such as a glass fabric with a synthetic resin such as an epoxy resin and then curing the synthetic resin; synthetic resin films such as a polyimide film; adhesive-applied laminates; and adhesive-applied ceramic plates.

It is preferred to apply both heat and pressure upon superposing the carrier metal foil, which carries the desired wiring pattern formed thereon, on the insulating substrate with the side of the wiring pattern being positioned inside and hence embedding the wiring pattern in the insulating substrate.

In the wiring-pattern-bearing carrier metal foil which is employed in the present invention and is composed of the carrier metal foil made of the first metal, the thin layer formed on one side of the carrier metal foil and made of the second metal whose etching conditions are different from those of the first metal, and the desired wiring pattern formed on the surface of the thin layer, which is made of the second metal, with the third metal whose etching conditions are different from those of the second metal, the coefficient of thermal expansion of the wiring-pattern-bearing carrier metal foil can be adjusted to bring it into conformity with that of the insulating substrate, in which the wiring pattern is embedded under heat and pressure, in a heating temperature range by suitably choosing the material and thickness of the carrier metal foil and also the material, thickness and number of the thin metal layer(s) formed On the one side of the carrier metal foil. This makes it possible to improve the dimensional accuracy of the wiring pattern.

The wiring-pattern-bearing metal foil has high flexibility so that the shape of the insulating substrate in which the wiring pattern is embedded, namely, the shape of the surface into which the wiring pattern is transferred can be not only a planar surface but also a curved surface. When a stainless steel sheet or the like is employed as a carrier plate, a limitation is obviously imposed on its size. A carrier metal foil, however, is employed in the present invention, thereby making it possible not only to achieve enlargement with ease but also to continuously perform the processing steps starting with the carrier metal foil until the fabrication of the wiring-pattern-bearing metal foil.

As a modification of the process shown in FIG. 1, it is possible to form the wiring pattern 13 by an etching technique. Namely, a wiring pattern can be formed by forming a third metal layer on the entire surface of the thin layer 11 of the second metal in FIG. 1(b), forming an etching pattern and then etching the third metal layer. Although the carrier metal foil and the nickel layer are all etched off in FIGS. 1(f) and 1(g), they may be left (for example, as wiring patterns) at predetermined parts thereof as needed. Further, for example, a thin nickel layer (equivalent to the thin layer 11 made of the second metal in FIG. 1) can be formed, for example, on one side of a copper foil which may be a rolled copper foil. In addition, for example, a copper layer (equivalent to the carrier metal foil 10 made of the first metal in FIG. 1) is then formed. The copper foil such as the rolled copper foil is etched at desired parts to form a wiring pattern. The wiring pattern can then be embedded in the insulating substrate. Since the wiring pattern formed by etching the rolled copper foil has a high degree of flexibility, flexible wiring boards obtained by embedding such a wiring pattern in polyimide films are useful for the connection of printer drivers or in applications where reliability is considered to be important, for example, in aerospace applications.

Further, the thin metal layer such as the nickel layer can be omitted provided that the etching conditions of the carrier metal foil are different from those of the wiring pattern. The above-described merits available from the use of the metal foil as a carrier can also be brought about in this case.

The wiring board fabrication process according to the second embodiment of this invention will next be described with reference to FIG. 2. The process of the second embodiment can be followed to continuously perform the processing sequences illustrated in FIG. 1.

Figure 2A:
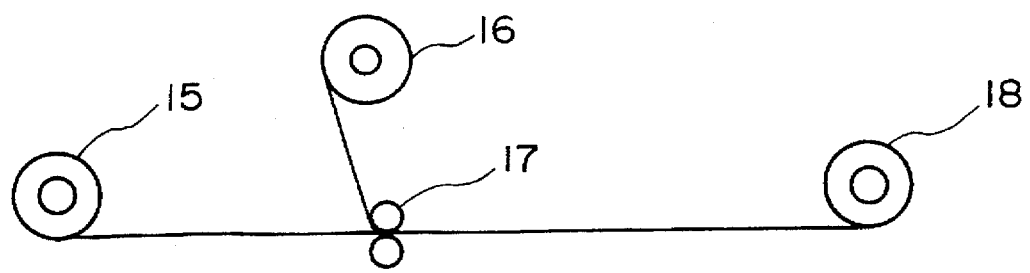
FIG. 2 depicts sequences of a wiring board fabrication process according to a second embodiment of this invention, said process being adapted to conduct the process of FIG. 1 in a continuous flow.

FIG. 2(a) shows a resist lamination step, in which numeral 15 indicates a copper foil roll of a 400-mm wide, elongated copper foil which comprises a 35-μm thick copper foil and a 1-μm nickel layer formed on one side of the copper foil. A resist film 16 is continuously laminated by a roll laminator 17 onto the nickel-layer-bearing side of the elongated copper foil 15. Designated at numeral 18 is a roll of a resist-applied copper foil.

Figure 2B:
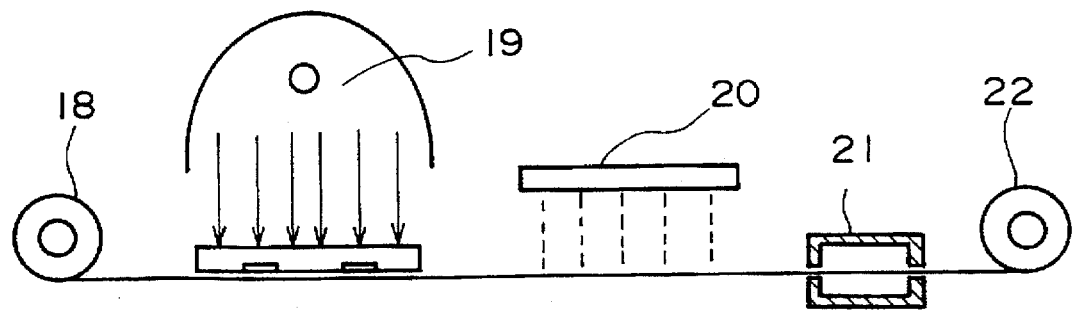

FIG. 2(b) illustrates an exposure step and a development step. The resist-covered side of the resist-applied copper foil 18 is continuously exposed through a photomask to the light from a light source 19. The thus-exposed resist is developed through a developing apparatus 20 and then dried through a drier 21, whereby a resist-patterned copper foil 22 is continuously formed.

Figure 2C:
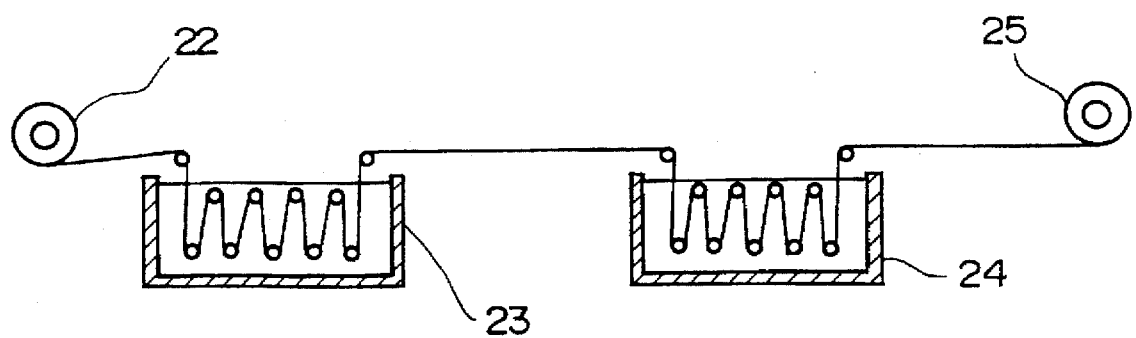

FIG. 2(c) shows a pattern plating step, in which the resist-patterned copper foil 22 is caused to pass through a copper electroplating bath 23 so that copper is plated at a high velocity to continuously form the desired wiring pattern to a thickness of 20 μm. The copper foil with the wiring pattern is then rinsed and the resist is stripped off. The copper foil is then caused to pass through an oxidation treatment bath 24 to oxidize the surface of the wiring pattern so that its adhesion to an insulating substrate can be improved. The copper foil is then rinsed and dried, whereby a copper foil 25 having a patterned plating (i.e., a wiring pattern) is continuously formed.

According to the second embodiment of this invention, the formation of a wiring pattern including the steps of resist coating, exposure, development and plating can be automated into a continuous flow by using an elongated copper foil in the form of a roll. The productivity can hence be improved.

The thus-obtained copper foil 25 with the patterned plating (i.e., the wiring pattern) is continuously cut into predetermined sizes. Each piece so cut is pressed under heat against an insulating substrate, such as a glass fabric-epoxy resin laminate having a glass fabric-epoxy resin prepreg placed thereon, so that the wiring pattern is embedded in the insulating substrate. The resulting laminate is then subjected to external machining, followed by the etching of the copper foil and nickel layer at desired parts thereof so that a wiring board is obtained.

The above process makes it possible to fabricate a wiring board with a microcircuit formed therein at line and space widths of 50 μm or less. It has a planar wiring structure which is optimal for micropitch soldering, so that the wiring board so fabricated is suitable for high-density surface mounting. A pad is required to have high widthwise dimensional accuracy and high flatness especially when the pad is used as a high-density wire bonding pad for mounting bare chips. The wiring board according to the present invention permits the formation of an excellent high-density wire-bonding pad. The process of the second embodiment is of the type that an insulating substrate is combined subsequent to continuous formation of wiring patterns on a continuous carrier metal foil such as an elongated copper foil, whereby the process of the second embodiment can be practiced by an automated continuous fabrication line operated in an extremely clean environment. It also features fewer causes for potential defects, excellent productivity, high mass productivity, etc.

Referring next to FIG. 3, the multilayer wiring board fabrication process according to the third embodiment of the present invention will be described.

Figure 3A:
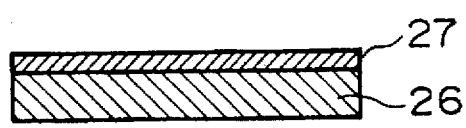
FIG. 3 illustrates several processing steps of a multilayer wiring board fabrication process according to a third embodiment of this invention.
Figure 3B:
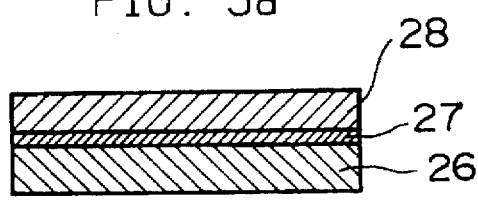

Formed on one side of a carrier metal foil 26 is a thin metal layer 27 whose etching conditions are different from those of the carrier metal foil 26 [FIG. 3(a)]. Although a copper foil is common as the carrier metal foil 26, a stainless steel foil with a copper foil formed thereon by electroplating can also be employed. On the other hand, nickel or solder is common as the material of the thin metal layer 27, but no particular limitation is imposed thereon and electroplating, electroless plating or vacuum deposition technique can be applied as a film-forming method. Next, a metal layer 28 whose etching conditions are different form the thin metal layer 27 is provided on the thin metal layer 27 whereby a triple-layer foil is formed [FIG. 3(b)]. In this case, as the combination of the three layers (metal foil 26/thin metal layer 27/metal layer 28) in the triple-layer foil, the combination of copper foil/thin nickel foil/copper layer can be mentioned by way of example. Although no particular limitation is imposed on the thickness of each layer in the triple-layer foil, a film thickness of 1–3 μm or so is needed for the thin metal layer 27 because the thin metal layer 27 is required to exhibit barrier effects upon etching the carrier metal layer 26 and the metal layer 28.

Figure 3C:
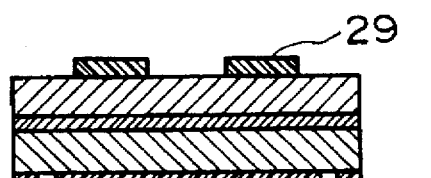
Figure 3D:
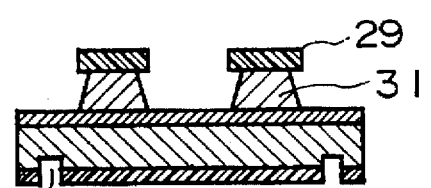
Figure 3E:
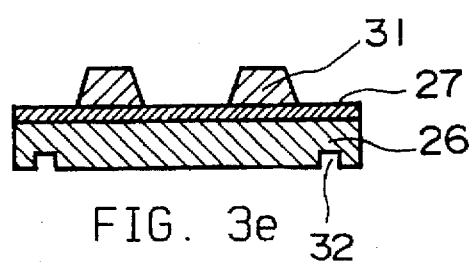

A resist pattern 29 for the formation of a desired wiring pattern and another resist pattern 30 for the formation of a desired location pattern are next formed on the surfaces of the metal layer 28 and the carrier metal foil 26 of the triple-layer foil, respectively [FIG. 3(c)]. Subsequent to the formation of the desired wiring pattern 31 and location pattern 32 by chemical etching [FIG. 1(d)], the resist patterns 29,30 are stripped off [FIG. 3(e)].

In this case, it is possible to form the desired wiring pattern and location pattern by a plating technique after the corresponding resist patterns have been formed on the opposite sides of a double-layer foil formed of the carrier metal foil 26 and the thin metal layer 27 [FIG. 3(a)], respectively. When this plating technique is applied, it is desirous to limit the thickness of the location pattern to 10 μm or less by controlling the current density during the plating because a press end plate may be damaged upon lamination of the foil with an insulating substrate if the thickness of the location pattern is great.

The carrier metal foil 26 with the wiring pattern 31 and the location pattern 31 both formed thereon is next superposed on the insulating substrate 33 with the side of the wiring pattern 31 being positioned inside, whereby the wiring pattern 31 is embedded in the insulating substrate 33

Figure 3F:
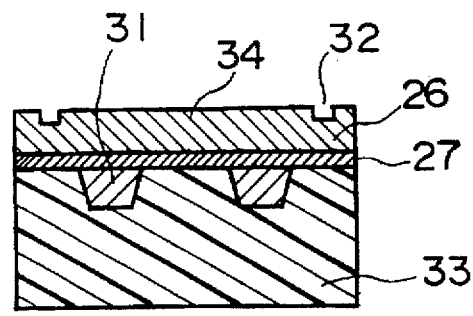
Figure 3G:
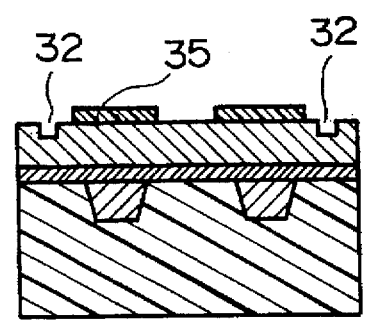
Figure 3H:
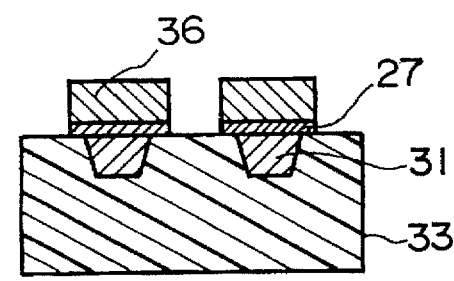

[FIG. 3(f)]. The wiring pattern 31 can be easily embedded in a resin of the insulating substrate 33 by the thermal bonding on a press.

An exposed surface 34 of the carrier metal foil 26 is next mechanically polished, followed by the formation of a resist layer. Using a photomask in relation to the location pattern 32 as a reference, the resist layer is exposed imagewise to light at desired regions and then developed to form a desired resist pattern 35 [FIG. 3(g)]. The carrier metal foil and thin metal layer are then removed at the desired regions by chemical etching so that the desired pattern 36 is formed [FIG. 3(h)]. The pattern 36 which has been formed by etching the carrier metal foil and the thin metal foil can be used as a surface wiring (a wiring pattern) without any further processing or treatment. When one or more layers are needed, it can also be used as a connecting part for the wiring pattern 31 and its upper wiring layer. By using the location pattern 32 formed by a lithographic process on the opposite side of the carrier metal foil to the side on which the wiring pattern 31 has been formed, it is possible not only to shorten the overall fabrication process but also to improve the working accuracy.

Compared with the conventional common process in which a location pattern is exposed by endmilling, the process of the third embodiment has shortened the over-all process sequences and, owing to the complete elimination of any mechanical damage to the location pattern, has also improved the dimensional accuracy. Compared also with the process in which holes are formed by a drill or the like through a carrier metal foil subsequent to the formation of a wiring pattern, the process of the third embodiment is free of problems such as the formation of burrs upon milling the carrier metal foil and the exudation of a resin subsequent to pressing, thereby permitting stable fabrication. Further, the process in which a carrier metal foil and a thin metal foil are etched at predetermined parts after a wiring pattern has been embedded in an insulating substrate has difficulty in determining a reference point for the setting of the etched parts. In the process of the third embodiment, however, it is unnecessary to newly provide a reference point subsequent to the embedding of a wiring pattern in an insulating substrate so that the positioning accuracy of the wiring pattern and the productivity have been both improved.

The multilayer wiring board fabrication process according to the fourth embodiment of this invention will next be described with reference to FIG. 4.

On one side of a carrier metal foil 37, a thin metal film 38 having different dissolution characteristics from the carrier metal foil 37 is formed, followed by the formation of a resist film. The resist film is patterned in the form of a desired wiring by a photolithographic technique. Then, a metal layer corresponding to the wiring is also formed by electroplating so that a first wiring pattern 39 is provided. The resist is then stripped off [FIG. 4(a)]. In this manner, it is possible to form a wiring pattern having a line width of 20 μm and a thickness of 20 μm.

The carrier metal foil 37 with the first wiring pattern 39 formed thereon is superposed on an insulating substrate 40 with the side of the first wiring pattern 39 being positioned inside, so that the first wiring pattern 39 is embedded in the insulating substrate 40. The first wiring pattern 39 can be easily embedded in a resin of the insulating substrate 40 by its thermal bonding on a press [FIG. 4(b)].

When the carrier metal foil 37 is etched from the side on which the first wiring pattern 39 is not formed, pattern etching is conducted by a photolithographic technique so that the carrier metal foil 37 is allowed to remain in the form of pillars at locations where interlayer connection is desired. The etching stops at the thin metal film 38 which has been formed between the carrier metal foil 37 and the first wiring pattern 39 and has different dissolution characteristics from the carrier metal foil 37, so that a flat surface is formed except for interconnecting pillars 41 formed by etching the carrier metal foil 37. The exposed thin metal film 39 having the different dissolution characteristics is etched off. If the thin metal film, which has the different dissolution characteristics, is introduced at an intermediate point during the plating of the first wiring pattern, the resulting wiring board are recessed along its wiring conductive lines. This may be an effective means for improved interlayer insulation, but care must be exercised because occurrence of voids may be induced. Incidentally, the interposition of the thin metal film as an etching stopper is no longer required provided that the carrier metal foil 37 and the first wiring pattern 39 have different dissolution characteristics. In the manner described above, interconnecting pillars 41 as small as 0.05 mm or so in diameter can be formed at the accuracy of ±10 μm or higher [FIG. 4(c)].

The height of each interconnecting pillar is 10–300 μm, with 15–150 μm being preferred. The formation of the interconnecting pillars can also be conducted by mechanical machining such as electrical discharge machining instead of etching.

An insulating layer 42 is then formed on the first wiring pattern 39 (at parts other than the interconnecting pillars formed by etching the carrier metal foil) formed as described above. High insulating reliability is provided even if the insulating layer 42 is thin, because the surface of the insulating layer 40 is not rugged by the wiring. Accordingly, a thickness of 20–30 μm is sufficient as the thickness of the insulating layer 42. As a result of the formation of the insulating film 42, the interconnecting pillars 41 are covered so that a flat surface is again obtained [FIG. 4(d)]. To obtain good electrical connection with another wiring layer to be formed thereon, it is effective to remove any insulating resin film, which still remains on the interconnecting pillars 41, by plasma treatment, etching or the like. Since the insulating resin film still remaining on the interconnecting posts 41 is as thin as less than 5 μm, etching such as plasma treatment may be applied to the entire surface. Further, use of a photosensitive material as the insulating layer 42 makes it possible to adopt a photolithographic technique.

On the flat surface formed of the interconnecting pillars 41 and the insulating layer 42, a second wiring pattern 43 is formed in conduction with the interconnecting pillars 41. The formation of the second wiring pattern 43 can be conducted by either an etching process or an additive process. For example, the entire flat surface formed of the interconnecting pillars 41 and the insulating layer 42 are metalized to establish conduction with the interconnecting pillars 41 and the metal layer is then patterned to form the second wiring pattern 43 (etching process). For the metallization which achieves both the surface metallization and interlayer connection at the same time, a vacuum deposition technique such as sputtering can be adopted. Since a thin film is formed in this case, it is possible to apply a semi-additive process in which a resist film is formed on the thin film and then patterned, electroplating is applied thick, the resist is stripped off, and the thin metal film layer formed at the beginning is then etched off. The second wiring pattern 43 can be formed with a line width of about 20 μm and a line thickness of about 20 μm.

The multilayer wiring board according to the fifth embodiment of the present invention will next be described with reference to FIG. 5

Figure 4A:
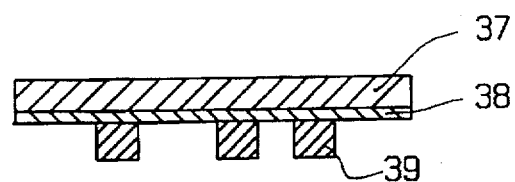
FIG. 4 sen several processing steps of a multilayer wiring board fabrication process according to a fourth embodiment of this invention.
Figure 4B:
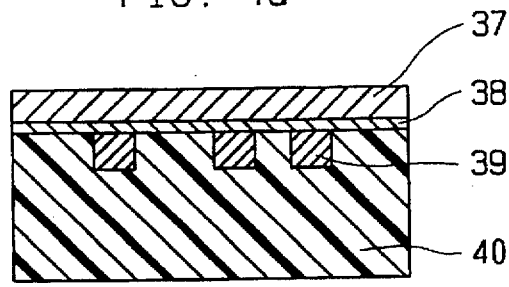
Figure 4C:
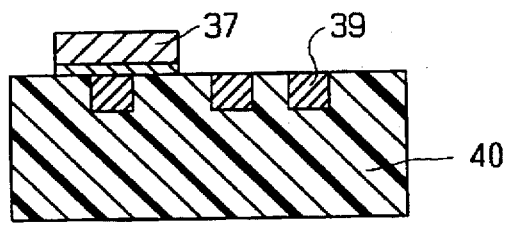
Figure 4D:
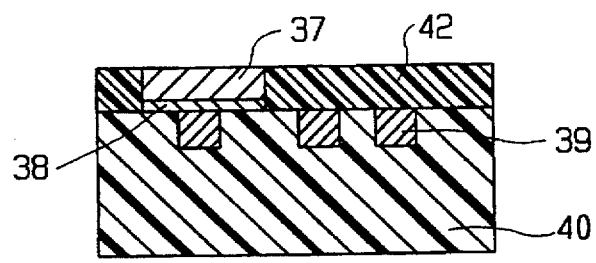
Figure 4E:
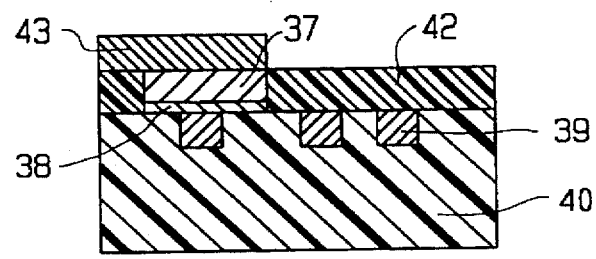
Figure 5A:
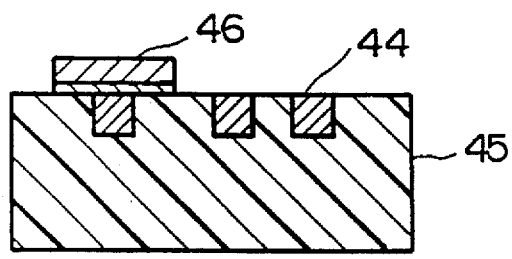
FIG. 5 illustrates several processing steps of a multilayer wiring board fabrication process according to a fifth embodiment of this invention.
Figure 5D:
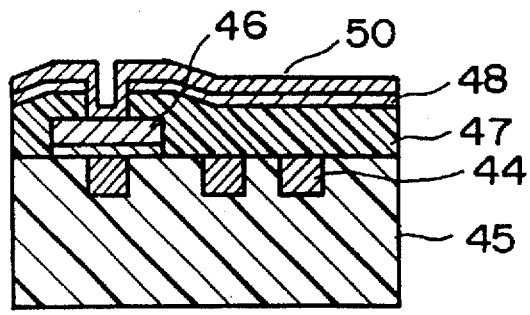
Figure 5B:
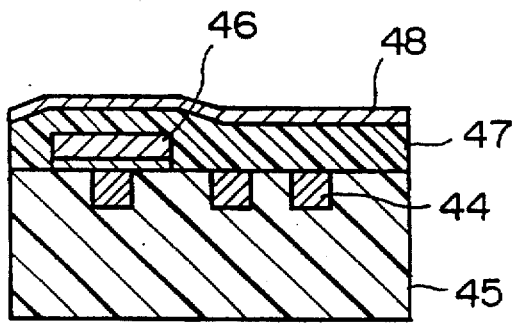
Figure 5E:
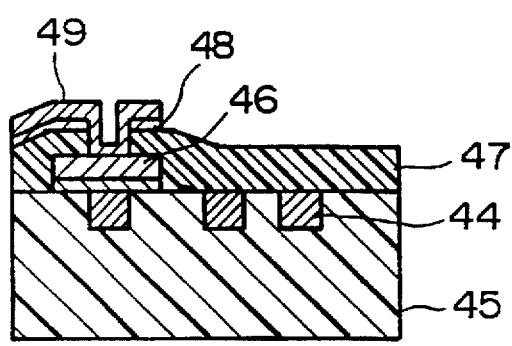
Figure 5C:
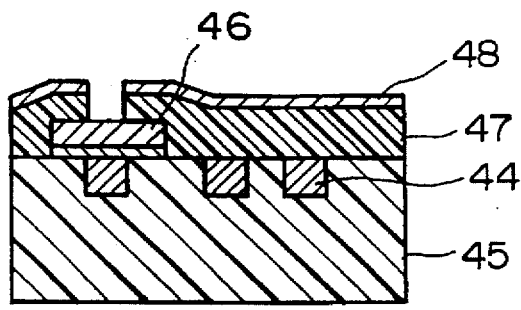

In a manner similar to the steps of FIGS. 4(a) to 4(c), a wiring board is obtained wish a first wiring pattern 44 embedded in a resin of an insulating substrate 45 and interconnecting pillars 46 formed on the insulating substrate 45 [FIG. 5(a)]. An insulating layer 47 is formed on the first wiring pattern 44 (at parts other than the interconnecting pillars formed by etching a carrier metal foil). High insulating reliability is provided even if the insulating layer 47 is thin, because the insulating substrate 45 is free of ruggedness of the wiring. A thickness of 20–30 μm or so is therefore sufficient as the thickness of the insulating layer 47.

A metal foil 48 is next applied on the insulating substrate 45 with the insulating layer 47 interposed therebetween. The metal foil 48 is patterned so that the metal foil 48 is removed at parts corresponding to the interconnecting pillars 46. Using the metal foil as an etching resist, the insulating layer 47 is removed at the parts where the metal foil has been removed. Namely, the metal foil 48 is applied to the insulating substrate 45 with an uncured resin material interposed therebetween, said resin material serving to provide the insulating layer 47. After curing the resin material, the metal foil is used as a resist so that the metal foil contributes to the etching of the underlying insulating layer 47. Instead of applying the metal foil 48, it is possible to form a metal layer by using a vacuum deposition technique such as sputtering.

A second wiring pattern 49 is next formed in conduction with the interconnecting pillars 46. The formation of the second wiring pattern 49 can be applied to either an etching technique or an additive technique. The second wiring pattern 49 can be formed, for example, by metalizing the entire surface formed of the interconnecting pillars 46 and the metal foil 48 to establish electrical conduction between the resulting metal layer 50 and the interconnecting pillars 46 and then patterning the metal layer 50 together with the metal foil 48 to form the second wiring pattern 49. In this manner, a multilayer wiring board can be fabricated with high density and highly-reliable interconnection.

FIGS. 4 and 5 each illustrates a fabrication process of a multilayer wiring board, in which a second wiring pattern is formed on a wiring board with a first wiring pattern formed thereon. A multilayer wiring board can also be fabricated by a photo-via hole process. Namely, a multilayer wiring board can be fabricated by laminating a photosensitive resin layer on a wiring board on which a first wiring pattern has been formed, exposing and developing the photosensitive resin layer, milling holes through the thus-developed resin layer to the first wiring pattern and then forming a second wiring pattern in conduction with the first wiring pattern on the resin layer.

It has been described that a carrier metal foil can be used as interconnecting pillars by etching it at unnecessary parts. A carrier metal foil can also be used as follows:

(1) connecting bumps: Unnecessary parts of the carrier metal foil are etched off and the remaining parts are then soldered to form connecting bumps.

(2) Wiring for heavy current: At each part requiring a heavy current, a conductor cross-sectional area large enough for the heavy current is secured by a wiring pattern and a carrier foil formed by etching.

(3) Outer connecting leads: Lead portions are etched without providing any insulating layer, whereby outer connecting leads of a semiconductor package are formed.

(4) Parts connecting terminals: An insulating layer is coated on a surface layer, followed by polishing to expose only terminals.

With reference to FIG. 6, the multilayer wiring board according to the sixth embodiment of the present invention will hereinafter be described.

Figure 6A:
FIG. 6 shows several processing steps of a multilayer wiring board fabrication process according to a sixth embodiment of this invention.
Figure 6B:
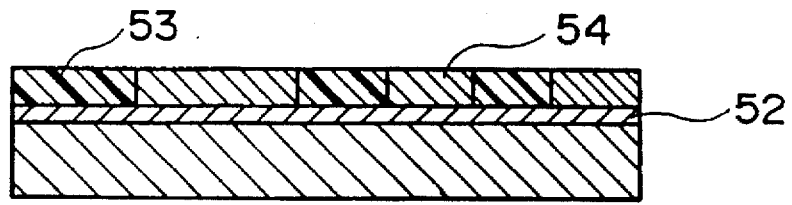
Figure 6C:
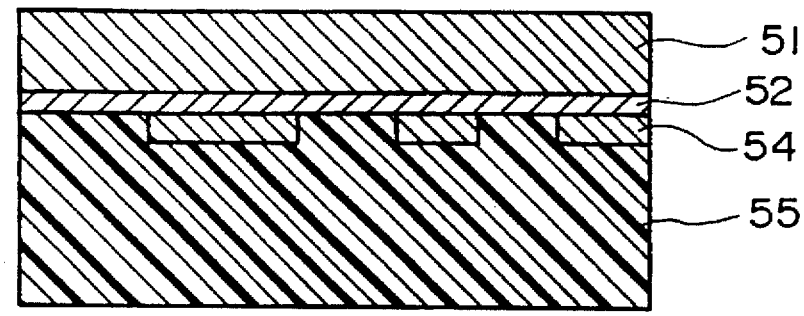
Figure 6D:
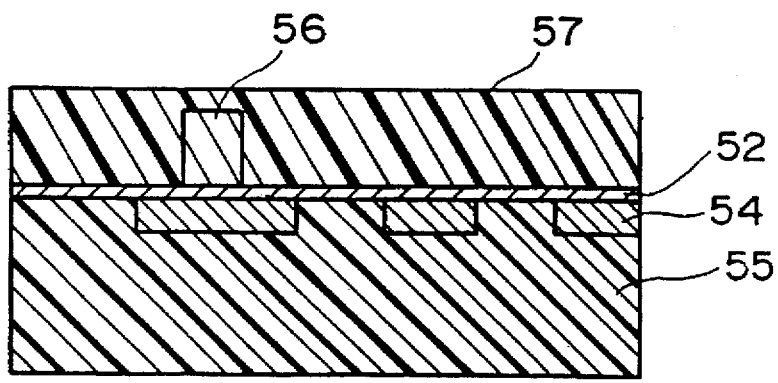
Figure 6E:
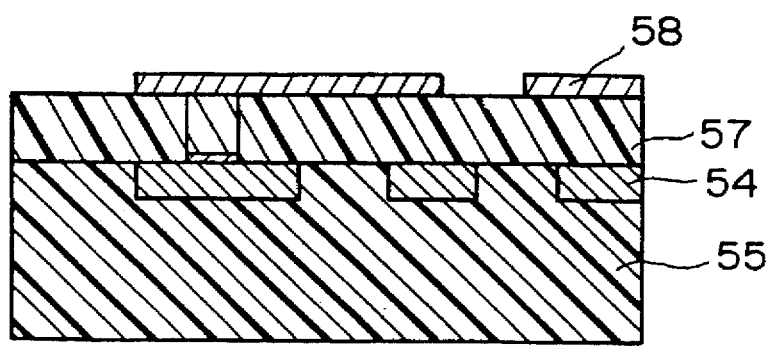

A thin copper layer 52 of about submicron or several microns in thickness is formed on a temporary substrate 51 which is a double-layer copper foil formed of a copper foil as a carrier metal foil and a thin layer formed on the copper foil with a metal (for example, nickel, chromium, titanium or solder) whose etching conditions are different from those of copper [FIG. 6(a)]. No particular limitation is imposed on the thickness of the thin copper layer but, from the viewpoints of productivity and the accuracy of chemical etching in a subsequent step, about 0.1–10 μm, most preferably 1–3 μm or so is preferred.

The formation of the thin layer of the metal whose etching conditions are different from copper can be achieved using a vacuum deposition technique such as sputtering or vacuum deposition in addition to electroplating or electroless plating which is commonly employed in the field of printed wiring boards. In view of productivity, however, the thin metal (e.g., nickel) layer and the thin copper layer are successively formed on the copper foil by an electroplating technique. A resist pattern 52 is next formed on the thin copper layer and a first desired wiring pattern 54 is then formed by electroplating [FIG. 6(b)]. After the resist pattern is stripped off, the temporary substrate 51 with the first desired wiring pattern 54 formed thereon is superposed on a first insulating substrate 55 with the side of the wiring pattern being positioned inside, whereby the first desired wired pattern 54 is embedded in the first insulating substrate 55 [FIG. 6(c)].

In this case, the first desired wiring pattern 54 can be easily embedded in a resin of the first insulating substrate 55 under heat and pressure on a press. Next, the temporary substrate 51 is removed by chemical etching to expose the thin copper layer 52. A resist is laminated on the thin copper layer and is patterned in the form of a desired wiring by a photolithographic technique. By an electroplating technique, a pillar pattern 56 is formed to provide interconnection. The resist pattern is thereafter stripped off and the thin copper layer is removed at desired regions by quick etching. A second insulating substrate 57 is superposed on the pillar pattern, whereby the pillar pattern 56 is embedded in the second insulating substrate 57 and the first and second insulating substrates 55,57 are integrated at the same time [FIG. 6(d)]. The pillar pattern 56 is then exposed from the side of the second insulating substrate 57, and a second wiring pattern 58 is then formed in conduction with the pillar pattern 56 on a surface which is formed of the pillar pattern 56 and the second insulating substrate 57 [FIG. 6(e)].

To achieve good electrical connection with the second wiring pattern, it is effective to mechanically polish the insulating layer on the pillar pattern or to remove or flatten the insulating layer by plasma etching or excimer laser illumination. For the formation of the second wiring pattern, a known etched foil technique or additive technique can be applied. For example, the second wiring pattern can be formed by metalizing a flat surface, which is formed of the pillar pattern and the second insulating substrate, to achieve electrical conduction with the pillar pattern and then patterning the metal layer. As an alternative, it is also possible to apply the semi-additive technique that a resist pattern is provided on a thin metal film formed by electroless plating or the like, electroplating is applied thick, the resist pattern is stripped off, and the thin metal film formed at the beginning is then removed by etching. Adoption of the semi-additive technique can provide even a high-density pattern with equisized lines and spaces of about 20 μm. In this manner, a high-density multilayer wiring board can be provided with high reliability in interlayer connection.

EXAMPLE 1

After one side of an electrolytic copper foil of 400 mm in width, 35 μm in thickness and 100 m in length ("SMR", trade name; product of NIHON DENKAI K.K.) was subjected to soft etching with a sulfuric acid-hydrogen peroxide solution (sulfuric acid concentration: 20 vol.%, hydrogen peroxide concentration: 4 vol.%, solution temperature: 49° C.), the foil was immediately dried with hot air (temperature: 70° C). The soft etch depth and the copper foil take-up speed were 1 μm and 2.0 m/min, respectively. A nickel plating layer was then formed to a thickness of 1 μm on the soft-etched side of the copper foil (hereinafter called the "carrier metal foil"). The nickel plating was conducted using a conventional Watts bath, and the current density and the carrier metal foil take-up speed were controlled at 2 $A/dm^2$ and 2 m/min, respectively. The carrier metal foil, which had been taken up into the form of a roll, and a photosensitive resist film ("ALPHO", trade name; product of The Nippon Synthetic Chemical Industry Co., Ltd.) were loaded on a continuous laminator (manufactured by Hitachi Chemical Technoplant Co., Ltd.). The photo-imagiable resist film was laminated on the nickel plating, whereby a resist-film-bearing carrier metal foil was obtained. The lamination was conducted under the following conditions: preheating temperature: 80° C., roll pressure: 30 psi, roll temperature: 110° C., and take-up speed: 0.8 m/min.

The resist film on the resist-film-bearing carrier metal foil was then exposed through a predetermined photomask, followed by development and hot-air drying so that a resist-pattern-bearing carrier metal foil with a fine resist pattern having equisized lines and spaces of 80 μm in width were obtained. The exposure was conducted by a continuous UV-exposure equipment ("EXM-1110", trade name; manufactured by Oak Inc.) at a feed speed of 1.0 m/min and an exposure of 90 $mJ/cm^2$. The development was carried out using a 1 wt. % solution of sodium carbonate (solution temperature: 30° C.) while controlling the spray pressure at 1.2 $kg/cm^2$.

Pattern copper plating was then applied to a thickness of 35 μm on the resist-pattern-formed side of the resist-pattern-bearing carrier metal foil at predetermined regions. The resist pattern was stripped off with an aqueous solution of potassium hydroxide (solution temperature: 45° C., concentration: 3 wt. %), and conventional black oxidation treatment was then applied as pre-lamination treatment. The black oxidation treatment was conducted at a take-up speed of 1.0 m/min. The copper plating was conducted at a current density of 3 $A/dm^2$ while using a copper sulfate bath as a copper plating bath.

By the above steps, a carrier metal foil was obtained with a copper wiring pattern which had been subjected to the adhesion-enhancing treatment for further lamination. Although the resist film formation step, the resist pattern formation step and the copper wiring pattern formation step were conducted by separate processing or treatment lines in this example, the present invention is not limited to this example. It is possible to conduct the whole process ranging from the nickel plating step to the pre-lamination treatment step by an integrated single fabrication line or to divide each step further.

EXAMPLE 2

On a roughened surface of an electrolytic copper foil of 350 square millimeters and 50 μm thick ("SMR", trade name; product of NIHON DENKAI K.K.), nickel and copper were successively electroplated to a thickness of 1 μm and a thickness of 25 μm, respectively, whereby a triple-layer foil of copper foil/nickel layer/copper layer was formed. The nickel plating was conducted at a current density of 2 $A/dm^2$ in a Watts bath, while the copper plating was effected at a current density of 4 $A/dm^2$ in a copper sulfate bath. Dry film resists ("RISTON T-1215", trade name; product of E.I. du Pont de Nemours Co., Inc.) were laminated on the opposite sides, respectively. After exposure through a double side aligned photomask, the resists were developed so that a resist pattern corresponding to the wiring pattern was formed on the surface of the copper layer and another resist pattern corresponding to the location pattern was formed on the copper foil. In this case, four register marks (5 mm in diameter) were used as the location pattern. The triple-layer foil was subjected to pre-heat treatment at 80° C. for 15 minutes. The lamination was conducted at 20 psi, a roll temperature of 104° C. and a feed speed of 0.5 m/min. The exposure was set at 120 $mJ/cm^2$ and the development was conducted using trichloroethane. Using a double-side etching apparatus manufactured by KAMERIYA K.K., the copper layer and copper foil were simultaneously etched off at desired parts with an alkali etchant ("A PROCESS", trade name; product of Japan Meltex Inc.; bath temperature: 40±3° C.). By controlling the spray pressure at 4 $kg/cm^2$ and 1 $kg/cm^2$ upon etching the copper layer and the copper foil, respectively, the wiring pattern having equisized lines and spaces of 150 μm in width and a line thickness of 35 μm and the register marks of 10 μm in depth were simultaneously formed on the front and back sides of the copper foil, respectively. After the resist patterns were stripped off with methylene chloride, black oxidation treatment was applied to the wiring pattern. By a laminating press, the foil so processed was then press-bonded with a glass-epoxy substrate with the wiring pattern being located inside. The laminating press was conducted at 170° C. and 40 $kg/cm^2$ for 120 minutes. After the laminating press, the surface of the carrier copper foil was mechanically polished so that a resist pattern was again formed using the above-mentioned register marks as reference points. The resist pattern was formed under the same conditions as described above. After the carrier copper foil was etched off at desired parts by using the alkali etchant described above, the resist pattern was stripped off with methylene chloride to obtain a desired surface wiring. The dimensional accuracy between the surface wiring and the wiring pattern already formed was good.

The carrier copper foil was used as a surface wiring in the example described above. It is also possible to use such a carrier copper foil as an interconnecting part in a multilayer wiring board. In this case, it is possible to follow such a process that the carrier copper foil is fabricated into a pillar-shaped pattern, an insulating resin layer is provided, the pillars are exposed at top portions thereof, and an upper wiring is formed.

EXAMPLE 3

On a copper foil of 18 μm in thickness, nickel was formed to a thickness of about 1 μm by electroplating and a film resist of 25 μm in thickness was then formed on the nickel layer. The resist was stripped off by exposure and development at parts corresponding to conductive lines of a desired wiring pattern. Copper was then plated to a thickness of 20 μm. The resist was then stripped off with a stripper. The resulting wiring-patterned metal foil was press-bonded with a glass fabric-polyimide resin substrate with a prepreg interposed therebetween while positioning the wiring pattern inside. A film resist was then applied on the copper foil, and was exposed and developed such that parts where interconnection was expected to be achieved would remain as resist patterns. Only the copper foil without the location where interconnection is desired was then etched off with an alkali ammonium etchant. The nickel plating layer was subsequently removed with an acid etchant ("Melstrip" trade name; product of Japan Meltex Inc., bath temperature: 45±3° C.). As a result, the substrate was flattened except for the interconnecting columns (pillars) of 60 μm in diameter and 18 μm in height. A photosensitive insulating polyimide layer ("Photo-PIQ 1045", trade name; product of Hitachi Chemical Co., Ltd.) was then formed to a thickness of about 20 μm, followed by the developing of the thin polyimide film, which still remained on the 18-μm high copper column (pillars), into small viaholes of 40 μm in diameter. The photosensitive polyimide film was thereafter heated at 200° C. for 2 hours so that the film was cured. After a thin oxide film on each circular copper column was removed with dilute sulfuric acid, a thin chromium film and a thin copper film were successively formed on the entire surface by sputtering. A film resist was then applied on the thin copper film. After the resist was stripped off at parts corresponding to conductive lines of a desired wiring pattern, a copper wiring layer was formed to a thickness of 20 μm by electroplating, followed by the removal of the resist. The copper was subjected to quick etching with ammonium persulfate, followed by the quick etching of the chromium layer with a mixture of a 300 g/l aqueous solution of potassium ferricyanide and a 50 g/l aqueous solution of potassium hydroxide.

As a result, a high-density wiring structure was formed in which wirings were accommodated in two layers at a line width and a line thickness of both 20 μm and an interconnection diameter of 60 μm within a thickness of 60 μm. The interconnection of the multilayer wiring board had high reliability.

EXAMPLE 4

On a roughened surface of an electrolytic copper foil of 35 μm in thickness ("SMR", trade name; product of NIHON DENKAI K.K.), nickel and copper were successively electroplated to a thickness of 0.5 μm and a thickness of 3 μm, respectively, whereby a triple-layer foil of copper foil/thin nickel layer/thin copper layer was formed. The nickel plating was conducted at a current density of 2 A/dm² in a Watts bath, while the electrolytic copper plating was effected at a current density of 3 A/dm² in a copper sulfate bath. A dry film resist ("PHT 887AF", trade name; product of Hitachi Chemical Co., Ltd.) was laminated on the thin copper layer. After a predetermined resist pattern was formed by exposure and development, A first wiring pattern with equisized lines and spaces of 50 μm was formed by copper electroplating. As a treatment for improved adhesion, black oxidation treatment was applied to the first wiring pattern. The resulting foil was press-bonded to an inner wiring substrate, said substrate having a predetermined number of layers, via a glass fabric-polyimide prepreg ("GIA-67-N", trade name; product of Hitachi Chemical Co., Ltd.) with the first wiring pattern being position inside. The pressing was conducted at 40 kg/cm² and 180° C. for 60 minutes. The copper foil and thin nickel layer were then successively subjected to selective etching to expose the thin copper layer. For the chemical etching of the copper foil and the thin nickel layer, a copper etchant ("A Process", trade name; product of Japan Meltex Inc.) and a nickel etchant ("Lip Master 1219", trade name; product of KIZAI K.K.) were used, respectively. A dry film resist of 50 μm in thickness was then patterned in a predetermined shape on the exposed thin copper layer, followed by the formation of pillar-shaped patterns of 150 μm in diameter and 50 μm in height by electroplating. The resist pattern was then stripped off and the thin copper film was etched off at desired parts with a solution of ammonium persulfate (concentration: 40 g/l; solution temperature: 40±3° C.). Two fusion-bonding polyimide films ("AS221F", trade name; product of Hitachi Chemical Co., Ltd.), each of 25 μm in thickness, were superposed on the pillar-shaped patterns and were press-bonded to the latter. The pressing was conducted at 40 kgf/cm² and 200° C. for 120 minutes. The polyimide layer present on the pillar-shaped patterns was then removed by mechanical grinding. After surface was roughened with a mixed solution of chromic acid and sulfuric acid, a thin copper film was formed to a thickness of 1 μm by electroless plating and a copper layer of 25 μm in thickness was then formed by copper electroplating. By a known etched foil process, a surface wiring pattern with equisized lines and spaces of 80 μm was thereafter formed.

As a result, a high-density wiring structure was formed in which high-density wirings were accommodated within a thickness of about 60 μm with the upper wiring having equisized lines and spaces of 80 μm and the lower wiring having equisized lines and spaces of 50 μm. The interconnection of the multilayer wiring board had high reliability.

What is claimed is:

1. A process for the fabrication of a wiring board, which comprises the following steps:

(a) forming, on one side of a continuous carrier metal foil made of a first metal which has sufficient flexibility to be rolled into a roll, a desired wiring pattern of a second metal whose etching conditions are different from those of the first metal, the resultant wiring-pattern-bearing metal foil having flexibility;

(b) superposing and pressing the carrier metal foil, which carries the desired wiring pattern formed thereon, on and against an insulating substrate with said wiring pattern facing said insulating substrate to embed the wiring pattern in said insulating substrate;

(c) etching off the carrier metal foil of the first metal at desired parts thereof; and (d) cutting the carrier metal foil, which carries the desired wiring pattern formed thereon, between said steps (a) and (b).

2. The process for the fabrication of a wiring board of claim 1, wherein, after said step (c) of etching off said desired parts of said carrier metal foil, a remaining part thereof forms a second wiring pattern.

3. A process for the fabrication of a wiring board, which comprises the following steps:

a) forming, on one side of a continuous carrier metal foil made of a first metal which has sufficient flexibility to be rolled into a roll and wherein the thickness of said carrier metal foil is about 20 μm to about 100 μm, a desired wiring pattern of a second metal whose etching conditions are different from those of the first metal, the resultant wiring-pattern-bearing metal foil having flexibility;

(b) superposing and pressing the carrier metal foil, which carries the desired wiring pattern formed thereon, on and against an insulating substrate with said wiring pattern facing said insulating substrate to embed the wiring pattern in said insulating substrate; and (c) etching off the carrier metal foil of the first metal at desired parts thereof.

4. A process for the fabrication of a wiring board, which comprises the following steps:

(a) forming a first wiring pattern on one side of a self-supporting carrier metal foil having a thickness of about 20 μm to about 100 μm so as to obtain a self-supporting wiring sheet comprising the carrier metal foil and the first wiring pattern;

(b) superposing and pressing said wiring sheet on and against an insulating substrate with said first wiring pattern facing the insulating substrate, to embed the wiring pattern in the insulating substrate; and (c) etching off said carrier metal foil at desired parts thereof to form a second wiring pattern.

* * * * *

UNITED STATES PATENT AND TRADEMARK OFFICE
CERTIFICATE OF CORRECTION

PATENT NO. : 5,664,325

DATED : September 9, 1997

INVENTOR(S) : Fukutomi et al.

It is certified that error appears in the above-identified patent and that said Letters Patent is hereby corrected as shown below:

The cover page should read as follows:

[30]  Foreign Application Priority Data
April 23, 1991  [JP]  Japan .................... 4-104675
Nov. 29, 1991  [JP]  Japan .................... 3-316252

Signed and Sealed this

Tenth Day of February, 1998

Attest:

BRUCE LEHMAN

*Attesting Officer*   *Commissioner of Patents and Trademarks*